(12) United States Patent
Inoue et al.

(10) Patent No.: US 7,667,520 B2
(45) Date of Patent: Feb. 23, 2010

(54) LEVEL SHIFT DEVICE HAVING REDUCED ERROR IN THE DUTY RATIO OF THE OUTPUT SIGNAL

(75) Inventors: Hiroshi Inoue, Osaka (JP); Yorimasa Funahashi, Osaka (JP); Satoshi Nakashima, Osaka (JP); Yasuyuki Okada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/896,528

(22) Filed: Sep. 4, 2007

(65) Prior Publication Data
US 2008/0246528 A1    Oct. 9, 2008

(30) Foreign Application Priority Data
Sep. 4, 2006    (JP) ............................. 2006-238832

(51) Int. Cl.
*H03L 5/00* (2006.01)
(52) U.S. Cl. ...................................... 327/333; 327/175

(58) Field of Classification Search ................. 327/175, 327/333
See application file for complete search history.

(56) References Cited

U.S. PATENT DOCUMENTS

| 5,912,574 | A  | * | 6/1999  | Bhagwan ..................... 327/157 |
| 5,977,807 | A  |   | 11/1999 | Watanabe |
| 2004/0085114 | A1 |   | 5/2004 | Hong et al. |
| 2004/0257142 | A1 | * | 12/2004 | Kanno et al. ................ 327/333 |
| 2005/0134355 | A1 |   | 6/2005 | Maede et al. |
| 2006/0066349 | A1 |   | 3/2006 | Murakami |
| 2006/0261851 | A1 |   | 11/2006 | Kim |

* cited by examiner

*Primary Examiner*—Lincoln Donovan
*Assistant Examiner*—John W Poos
(74) *Attorney, Agent, or Firm*—McDermott Will & Emery LLP

(57) ABSTRACT

The level shift device of the present invention comprises: a level shift circuit which converts a voltage level of a single input signal; and a duty correcting circuit which offsets a difference in the duty of an output signal of the level shift circuit with respect to the duty of the input signal.

6 Claims, 5 Drawing Sheets

LEVEL SHIFT DEVICE HAVING REDUCED ERROR IN THE DUTY RATIO OF THE OUTPUT SIGNAL

BACKGROUND OF THE INVENTION

1. Field of the Invention

The present invention relates to a technique for reducing an error generated in the duty ratio of an output signal with respect to the duty ratio of an input signal in a level shift device which outputs the input signal after shifting the level of the signal by a prescribed amount.

2. Description of the Related Art

FIG. 4 shows a structure of a conventional level shift device which outputs an input signal after shifting the level of the signal by a prescribed amount. This level shift device comprises a complementary signal generating circuit 10 having a low-potential power source VDD1 as a voltage source, and a level shift circuit 20 having a high-potential power source VDD2 as a voltage source. The level shift device shifts the level of input signal Sin of the low-potential power source VDD1 to the output signal of the high-potential power source VDD2. Reference numerals In1-In4 are inverters of the complementary signal generating circuit 10, QP1-QP4 are PMOS transistors of the level shift circuit 20, QN1-QN4 are NMOS transistors, LH is an R-S latch circuit, and In5, In6, and In8 are inverters.

The action of the level shift device shown in FIG. 4 will be described by referring to a timing chart shown in FIG. 5. The input signal Sin that is inputted to the level shift device is shown in (a) of FIG. 5. The input signal Sin is supplied first to the inverters In2 and In3 via the inverter In1. Further, the input signal Sin is supplied to the inverter In4 via the inverter In3. At that time, output signal S1 of the inverter In2 becomes a normal signal that has a delay $\tau_1$ with respect to the input signal as shown in (b) of FIG. 5. Meanwhile, output signal S2 of the inverter In4 becomes an inverted signal that has a delay $\tau_2$ with respect to the input signal as shown in (c) of FIG. 5.

The output signal S1 of the inverter In2 is supplied to the gate of the NMOS transistor QN2 of the level shift circuit 20. As shown in (b) of FIG. 5, when a high-level signal is supplied to the gate of the NMOS transistor QN2 at time $T_2$, the NMOS transistor QN2 turns to an ON state. At that time, a feedback signal (inverted signal of a signal S5) from the inverter In5 is high-level, so that the NMOS transistor QN1 turns to an ON state, and the PMOS transistor QP1 turns to an OFF state. Further, since its gate is earthed, the PMOS transistor QP2 is always in an ON state. The on-resistance of the PMOS transistor QP2 is set as a higher resistance than those of the NMOS transistors QN2 and QN1. With this, when a high-level signal is supplied to the gate of the NMOS transistor QN2 at the time $T_2$, input signal S3 to a NAND circuit N1 of the R-S latch circuit LH becomes low-level as shown in (d) of FIG. 5. Thus, the output signal S5 of the NAND circuit N1 gradually becomes high-level from the time $T_2$ onward of (f) in FIG. 5 due to the gate capacity of the inverter In5. The output signal S5 is supplied to the inverter In5. Further, after its polarity is inverted, the output signal S5 is supplied to the gates of the PMOS transistor QP1 and the NMOS transistor QN1.

Through this, the fall edge of input signal S3 inputted to the NAND circuit N1 of the R-S latch circuit LH is fed back as the fall edge of the input to the gates of the PMOS transistor QP1 and the NMOS transistor QN1 after a delay of a prescribed amount of time. Due to the feedback signal, the PMOS transistor QP1 turns to an ON state, the NMOS transistor QN1 turns to an OFF state, and the input signal S3 to the NAND circuit N1 of the R-S latch circuit LH becomes high-level.

At that time, the other input signal S6 of the NAND circuit N1 is low-level, so that the output signal S5 of the NAND circuit N1 is maintained as high-level.

In the meantime, output signal S2 of the inverter In4 is supplied to the gate of the NMOS transistor QN4 of the level shift circuit 20. As shown in (c) of FIG. 5, when a high-level signal is supplied to the gate of the NMOS transistor QN4 at time $T_{12}$, the NMOS transistor QN4 turns to an ON state. At that time, a feedback signal (inverted signal of a signal S6) from the inverter In6 is high-level, so that the NMOS transistor QN3 turns to an ON state, and the PMOS transistor QP4 turns to an OFF state. Further, since its gate is earthed, the PMOS transistor QP3 is always in an ON state. The on-resistance of the PMOS transistor QP3 is set as a higher resistance than those of the NMOS transistors QN4 and QN3. With this, when a high-level signal is supplied to the gate of the NMOS transistor QN4 at time $T_{12}$, input signal S4 to a NAND circuit N2 of the R-S latch circuit LH becomes low-level as shown in (e) of FIG. 5. Thus, the output signal S6 of the NAND circuit N2 gradually becomes high-level from the time $T_{12}$ onward in (g) of FIG. 5 due to the gate capacity of the inverter In6. The output signal S6 is supplied to the inverter In6. Further, after its polarity is inverted, the output signal S6 is supplied to the gates of the PMOS transistor QP4 and the NMOS transistor QN3.

That is, the fall edge of the input signal S4 inputted to the NAND circuit N2 of the R-S latch circuit LH is fed back as the fall edge of the input to the gates of the PMOS transistor QP4 and the NMOS transistor QN3 after a delay of a prescribed amount of time. Due to the feedback signal, the PMOS transistor QP4 turns to an ON state, the NMOS transistor QN3 turns to an OFF state, and the input signal S4 to the NAND circuit N2 of the R-S latch circuit LH becomes high-level. At that time, the other output signal S5 of the NAND circuit N2 is low-level, so that the output signal S6 of the NAND circuit N2 is maintained as high-level.

Therefore, when a high-level signal is supplied to the gates of the NMOS transistors QN2, QN4, the output signals S5, S6 of the NAND circuits N1, N2 turn to high-level after a delay of a prescribed amount. The NAND circuits N1 and N2 are in feedback connection where the output of each NAND circuit is fed back to the input of the other. Thus, when the output signal S5 of the NAND circuit N1 becomes high-level at time $T_3$, the output signal S6 of the NAND circuit N2 turns to low-level gradually due to the gate capacity of the inverter In6 as shown in (g) of FIG. 5. Further, when the output signal S6 of the NAND circuit N2 becomes high-level at time $T_{13}$, the output signal S5 of the NAND circuit N1 turns to low-level gradually due to the gate capacity of the inverter In5 as shown in (h) of FIG. 5.

The output signal S6 of the NAND circuit N2 is outputted after the polarity thereof being inverted by an inverter In8. Thus, level-shift output signal S8 that is the output of the inverter In8 becomes the one as shown in (h) of FIG. 5. The rise edge of the level-shift output signal S8 has a delay $\tau_F$ with respect to the fall edge of the input signal S3 of the NAND circuit N1 shown in (d) of FIG. 5. Meanwhile, the fall edge of the level-shift output signal S8 has a delay $\tau_R$ with respect to the fall edge of the input signal S4 of the NAND circuit N2 shown in (e) of FIG. 5.

Now, high-level period $T_H$ and low-level period $T_L$ of the level-shift output signal S8 will be investigated. Assuming that the duty ratio of the input signal Sin to the complementary signal generating circuit 10 is 50%, and the half wavelength is $T_0$, the high-level period $T_H$ can be expressed as $T_H=T_0-(\tau_1+\tau_P)+(\tau_2+\tau_R)$, and the low-level period $T_L$ can be expressed as $$T_L=2\times T_0-T_H.$$

Therefore, provided that $T_L>T_H$, the difference $\Delta T$ between the high-level period $T_H$ and the low-level period $T_L$ can be expressed as $$\Delta T=T_L-T_H=2\{(\tau_1-\tau_2)+(\tau_P-\tau_R)\}.$$

Assuming that $\tau_2=2\times\tau_1$, and $\tau_P=2\times\tau_R$, for example, it can be expressed as $$\Delta T=2(\tau_R-\tau_1).$$

When the above is looked at on the basis of the output signal S2 of the inverter In4 from a different point of view, the fall edge (at time $T_{13}$) of the level-shift output signal SB has a delay $\tau_R$ with respect to the rise edge (at time $T_{12}$) of the output signal S2. The output signal S1 of the inverter In2 is retarded with respect to the input signal Sin by the amount of time $\tau_1$ that is generated by the inverter In2. The output signal S2 of the inverter In4 is retarded with respect to the input signals Sin by the amount of time $\tau_1'$ that is generated the inverters In3 and In4. It is considered that $\tau_1'=\tau_1$, assuming that the inverters In2, In3, and In4 have the same characteristics.

The rise edge (at time $T_4$) of the level-shift output signal S8 is retarded from the rise edge (at time $T_2'$) of the output signal S2 by the amount of $$\tau_P-\tau_1'=\tau_P-\tau_1=2\tau_R-\tau_1.$$

That is, the delay of the rise edge of the level-shift output signal S8 with respect to the output signal S2 is $(2\tau_R-\tau_1)$, while the delay of the fall edge of the level-shift output signal S8 with respect to the output signal S2 is $\tau_R$ as mentioned above. Therefore, the high-level period $T_H$ of the level-shift output signal S8 is the length that is obtained by shortening the half wavelength $T_0$ of the input signal Sin by the amount of $(2\tau_R-\tau_1)-\tau_R=\tau_R-\tau_1$. In the meantime, the low-level period $T_L$ of the level-shift output signal S8 is the length that is obtained by extending the half wavelength $T_0$ of the input signal Sin by the amount of $(\tau_R-\tau_1)$. Thus, the difference $\Delta T$ between the high-level period $T_H$ and the low-level period $T_L$ becomes as $$\Delta T=(\tau_R-\tau_1)\times 2=2(\tau_R-\tau_1), \text{ which is consistent with the explanation provided above.}$$

Since $\tau_R\neq\tau_1$, the difference $\Delta T$ between the high-level period $T_H$ and the low-level period $T_L$ does not take a value, 0. That is, there is an error generated in the duty ratio of the level-shift output signal S8 with respect to the duty ratio of the input signal Sin.

As described, with the conventional circuit, there is a fluctuation generated between the duty ratios of both signals, due to a delay difference between the two signals generated in the complementary signal generating circuit and a delay in propagation of the signals of the R-S latch circuit used in the level shift circuit.

SUMMARY OF THE INVENTION

The main object of the present invention therefore is to provide a level shift device that has less error generated in the duty ratio of the output signal with respect to the duty ratio of the input signal.

In order to achieve the aforementioned object, a level shift device according to the present invention comprises:
 a level shift circuit which converts a voltage level of a single input signal; and
 a duty correcting circuit which offsets a difference in duty of an output signal of the level shift circuit with respect to the duty of the input signal.

In this structure, the duty correcting circuit is provided at a latter stage of the level shift circuit. Therefore, the error in the duty ratio of the level-sift output signal with respect to the duty ratio of the input signal can be reduced.

More specifically, in the level shift device of the present invention, level shift circuit comprises an R-S latch circuit which converts a signal whose voltage level is being converted into first and second signals, and
 the duty correcting circuit comprises:
 a first NMOS transistor which has the first signal connected to its gate, and has its source earthed;
 a second NMOS transistor which has the second signal connected to its gate, and has its source earthed;
 a first inverter which has its input terminal connected to a drain of the second NMOS transistor, and has its output terminal connected to a drain of the first NMOS transistor;
 a second inverter which has its input terminal connected to the drain of the first NMOS transistor, and has its output terminal connected to the drain of the second NMOS transistor;
 a first buffer which level-shifts an output signal of the first inverter; and
 a second buffer to which an output signal of the second inverter is inputted.

Further, provided that the conductive type in the above-described structure is switched from the NMOS type to the PMOS type, the level shift device according to the present invention further comprises a high-potential power source, wherein:
 the level shift circuit comprises an R-S latch circuit which converts a signal whose voltage level is being converted into first and second signals; and
 the duty correcting circuit comprises
 a first PMOS transistor which has the first signal connected to its gate, and has its source earthed,
 a second PMOS transistor which has the second signal connected to its gate, and has its source connected to the high-potential power source,
 a first inverter which has its input terminal connected to a drain of the second PMOS transistor, and has its output terminal connected to a drain of the first PMOS transistor,
 a second inverter which has its input terminal connected to the drain of the first PMOS transistor, and has its output terminal connected to the drain of the second PMOS transistor,
 a first buffer which level-shifts an output signal of the first inverter, and
 a second buffer to which an output signal of the second inverter is inputted.

The duty correcting circuit corrects the duty ratio of the signal that corresponds to the conventional level-shift output signal, by utilizing a rectangular wave signal that is generated and outputted separately from the signal that corresponds to the conventional level-shift output signal outputted from the R-S latch circuit of the level shift circuit. Specifically, the fall edge of the signal that corresponds to the level-shift output signal is defined by delaying the fall edge of the signal that corresponds to the conventional level-shift output signal to the rise edge of the rectangular wave signal. Meanwhile, the rise edge of the level-shift output signal is defined by delaying the rise edge of the signal that corresponds to the conventional level-shift output signal through an inverse parallel connection of the first and the second inverters. Through adjusting the delay relation, the difference between the high-level period and the low-level period of the level-shift output signal is decreased so as to reduce the error in the duty ratio of the output signal with respect to the duty ratio of the input signal.

In the level shift device of the present invention, there is such a form that:

under a condition where the first input signal is high-level and the second input signal is low-level, an output of the first buffer becomes low-level and an output of the second buffer becomes high-level;

under a condition where the first input signal is low-level and the second input signal is high-level, the output of the first buffer becomes high-level and the output of the second buffer becomes low-level; and under a condition where the first and second input signals are both low-level, the outputs of the first and second buffers are maintained.

It is assumed herein that the either one or both of the outputs from the first and second buffers become(s) the output signal (s) in sync with the rise edges of the first and second input signals. Both inputs to the duty correcting circuit do not turn to high-level simultaneously.

The present invention provides the duty correcting circuit for correcting the duty ratio of the output signal by such a method that utilizes the two signals outputted from the R-S latch circuit of the level shift circuit or other methods, so as to adjust the phases of the fall edge and the rise edge. Through this, it becomes possible to reduce the error in the duty ratio of the output signal with respect to the duty ratio of the input signal by decreasing the difference between the high-level period and the low-level period of the level-shift output signal.

The technique of the present invention is useful as a level shift device which performs level shift without changing the duty ratio.

BRIEF DESCRIPTION OF THE DRAWINGS

Other objects of the present invention will become clear from the following description of the preferred embodiments and the appended claims. Those skilled in the art will appreciate that there are many other advantages of the present invention possible by embodying the present invention.

DETAILED DESCRIPTION OF THE INVENTION

Embodiments of the level shift device according to the present invention will be described hereinafter by referring to the accompanying drawings.

FIRST EMBODIMENT

Figure 1:
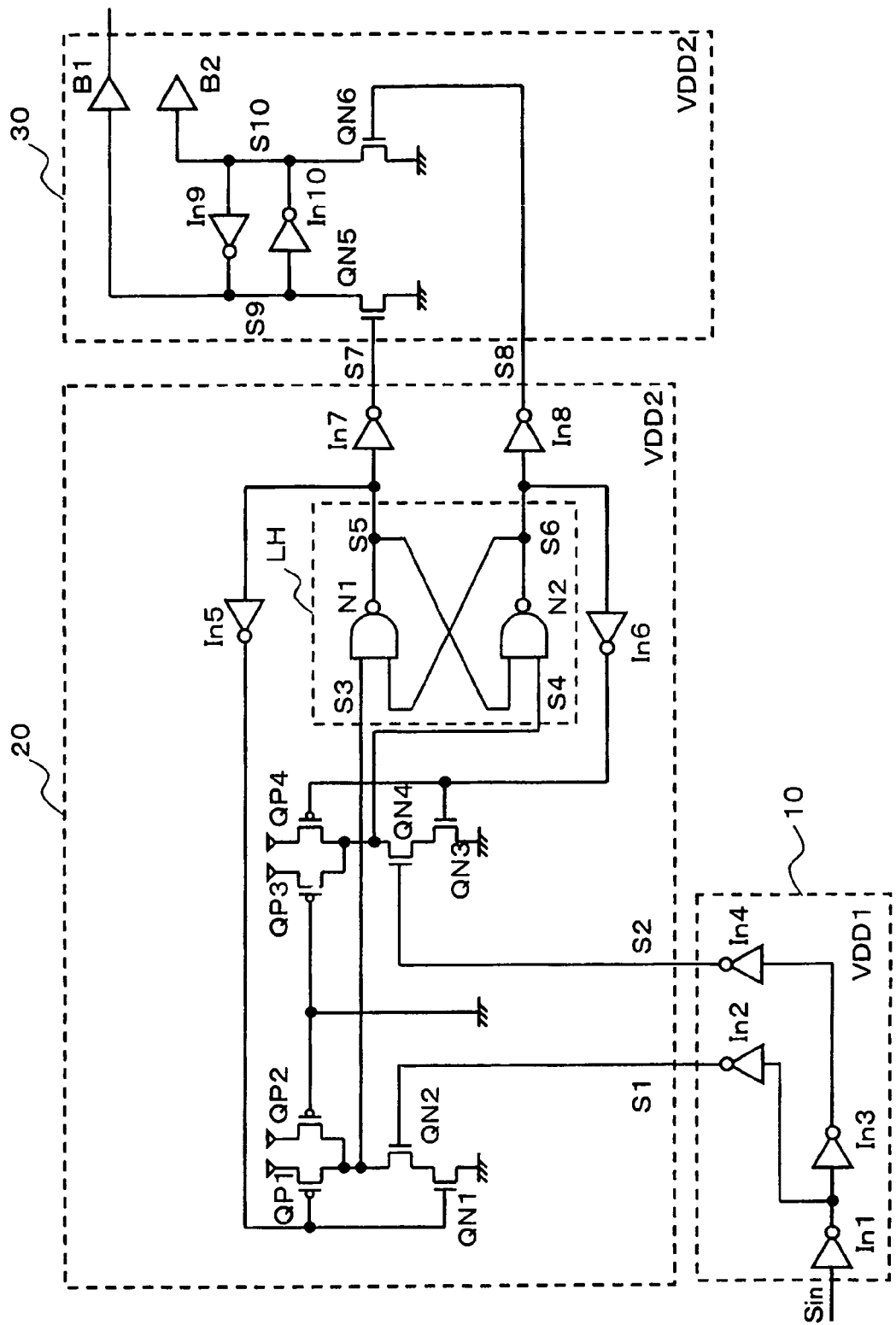
FIG. 1 is a circuit block diagram of a level shift device according to a first embodiment of the present invention.

FIG. 1 is a circuit block diagram of a level shift device according to a first embodiment of the present invention. The level shift device according to this embodiment comprises: a complementary signal generating circuit 10 having a low-potential power source VDD1 as a voltage source; a level shift circuit 20 having a high-potential power source VDD2 as a voltage source; and a duty correcting circuit 30 having a high-potential power source VDD2 as a voltage source.

The complementary signal generating circuit 10 comprises four inverters In1, In2, In3, and In4. The output of the first inverter is connected to the input terminals of the second and third inverters In2, In3, and the output of the third inverter In3 is connected to the input terminal of the fourth inverter In4.

The level shift circuit 20 comprises four PMOS transistors QP1, QP2, QP3, QP4, four NMOS transistors QN1, QN2, QN3, QN4, an R-S latch circuit LH, and four inverters In5, In6, In7, In8.

Each source of the PMOS transistors QP1 and QP2 is connected to the high-potential power source, and each drain thereof is connected to the drain of the NMOS transistor QN2. Further, the gate of the PMOS transistor QP1 is connected to the output terminal of the inverter In5, and the gate of the PMOS transistor QP2 is earthed.

Each source of the PMOS transistors QP3 and QP4 is connected to the high-potential power source, and each drain thereof is connected to the drain of the NMOS transistor QN4. Further, the gate of the PMOS transistor QP4 is connected to the output terminal of the inverter In6, and the gate of the PMOS transistor QP3 is earthed.

The source of the NMOS transistor QN2 is connected to the drain of the NMOS transistor QN1, and the source of the NMOS transistor QN1 is earthed. The gate of the NMOS transistor QN2 is connected to the output terminal of the inverter In2 of the complementary signal generating circuit 10, and the gate of the NMOS transistor QN1 is connected to the output terminal of the inverter In5.

The source of the NMOS transistor QN4 is connected to the drain of the NMOS transistor QN3, and the source of the NMOS transistor QN3 is earthed. The gate of the NMOS transistor QN4 is connected to the output terminal of the inverter In4 of the complementary signal generating circuit 10, and the gate of the NMOS transistor QN3 is connected to the output terminal of the inverter In6.

The R-S latch circuit LH comprises first, second NAND circuits N1, N2, and it is so structured that output signal S5 of the NAND circuit N1 is fed back to one of the inputs of the NAND circuit N2, and output signal S6 of the NAND circuit N2 is fed back to one of the inputs of the NAND circuit N1. The other input terminal of the NAND circuit N1 is connected to the drain of the NMOS transistor QN2, and the other input terminal of the NAND circuit N2 is connected to the drain of the NMOS transistor QN4. The output signal S5 of the NAND circuit N1 is also connected to the inputs of the inverters In5, In7, and the output signal S6 of the NAND circuit N2 is also connected to the inputs of the inverters In6, In8.

The duty correcting circuit 30 comprises two NMOS transistors QN5, QN6, two inverters In9, In10, and two output buffers B1, B2. The NMOS transistor QN5 corresponds to the first NMOS transistor mentioned above. The NMOS transistor QN6 corresponds to the second NMOS transistor mentioned above. The inverter In9 corresponds to the first inverter mentioned above, and the inverter In10 corresponds to the second inverter mentioned above. The output buffer B1 corresponds to the first buffer mentioned above, and the output buffer B2 corresponds to the second buffer mentioned above.

Each source of the NMOS transistors QN5, QN6 is earthed, and each gate thereof is connected to the output terminals of the inverters In7, In8 of the level shift circuit 20, respectively. The drain of the NMOS transistor QN5 is connected to the output terminal of the inverter In9, to the input terminal of the inverter In10, and to the input terminal of the output buffer B1. The drain, of the NMOS transistor QN6 is connected to the input terminal of the inverter In9, to the output terminal of the inverter In10, and to the input terminal of the output buffer B2, respectively.

Next, the action of the level shift device according to the embodiment will be described by referring to the timing chart shown in FIG. 2. Input signal Sin inputted to the level shift device is shown in (a) of FIG. 2. The input signal Sin is first supplied to the inverters In2 and In3 via the inverter In1 of the complementary signal generating circuit 10. Further, the input signal Sin is supplied to the inverter In4 via the inverter In3. At this time, output signal S1 of the inverter In2 becomes a normal signal that has a prescribed delay $\tau_1$ with respect to the input signal Sin as shown in (b) of FIG. 2, and output signal S2 of the inverter In4 becomes an inverted signal that has a prescribed delay $\tau_2$ with respect to the input signal Sin as shown in (c) of FIG. 2.

The output signal S1 of the inverter In2 is supplied to the gate of the NMOS transistor QN2 of the level shift circuit 20. As shown in (b) of FIG. 2, when a high-level signal is supplied to the gate of the NMOS transistor QN2 at time $T_2$, the NMOS transistor QN2 turns to an ON state. At that time, a feedback signal (inverted signal of a signal S5) from the inverter In5 is high-level, so that the NMOS transistor QN1 turns to an ON state, and the PMOS transistor QP1 turns to an OFF state. Further, since its gate is earthed, the PMOS transistor QP2 is always in an ON state. The on-resistance of the PMOS transistor QP2 is set as a higher resistance than those of the NMOS transistors QN2 and QN1. With this, when a high-level signal is supplied to the gate of the NMOS transistor QN2 at the time $T_2$, input signal S3 to the NAND circuit N1 of the R-S latch circuit LH becomes low-level as shown in (d) of FIG. 2. Thus, the output signal S5 of the NAND circuit N1 gradually becomes high-level from the time $T_2$ onward of (f) in FIG. 2 due to the gate capacity of the inverter In5. The output signal S5 is supplied to the inverter In5. Further, after its polarity is inverted, the output signal S5 is supplied to the gates of the PMOS transistor QP1 and the NMOS transistor QN1.

Through this, the fall edge of the input signal S3 inputted to the NAND circuit N1 of the R-S latch circuit LH is fed back as the fall edge of the input to the gates of the PMOS transistor QP1 and the NMOS transistor QN1 after a delay of a prescribed amount of time. Due to the feedback signal, the PMOS transistor QP1 turns to an ON state, the NMOS transistor QN1 turns to an OFF state, and the input signal S3 to the NAND circuit N1 of the R-S latch circuit LH becomes high-level. At that time, the other output signal S6 of the NAND circuit N1 is low-level, so that the output signal S5 of the NAND circuit N1 is maintained as high-level.

In the meantime, the output signal S2 of the inverter In4 is supplied to the gate of the NMOS transistor QN4 of the level shift circuit 20. As shown in (c) of FIG. 2, when a high-level signal is supplied to the gate of the NMOS transistor QN4 at time $T_{12}$, the NMOS transistor QN4 turns to an ON state. At that time, a feedback signal (inverted signal of a signal S6) from the inverter In6 is high-level, so that the NMOS transistor QN3 turns to an ON state, and the PMOS transistor QP4 turns to an OFF state. Further, since its gate is earthed, the PMOS transistor QP4 is always in an ON state. The on-resistance of the PMOS transistor QP4 is set as a higher resistance than those of the NMOS transistors QN4 and QN3. With this, when a high-level signal is supplied to the gate of the NMOS transistor QN4 at the time $T_{12}$, input signal S4 to a NAND circuit N2 of the R-S latch circuit LH becomes low-level as shown in (e) of FIG. 2. Thus, the output signal S6 of the NAND circuit N2 gradually becomes high-level from the time $T_{12}$ onward in (g) of FIG. 2 due to the gate capacity of the inverter In6. The output signal S6 is supplied to the inverter In6. Further, after its polarity is inverted, the output signal S6 is supplied to the gates of the PMOS transistor QP4 and the NMOS transistor QN3.

Through this, the fall edge of the signal inputted to the NAND circuit N2 of the R-S latch circuit LH is fed back as the fall edge of the input to the gates of the PMOS transistor QP4 and the NMOS transistor QN3 after a delay of a prescribed amount of time. Due to the feedback signal, the PMOS transistor QP4 turns to an ON state, the NMOS transistor QN3 turns to an OFF state, and the input signal S4 to the NAND circuit N2 of the R-S latch circuit LH becomes high-level. At that time, the other output signal S5 of the NAND circuit N2 is low-level, so that the output signal S6 of the NAND circuit N2 is maintained as high-level.

Therefore, when a high-level signal is supplied to the gates of the NMOS transistors QN2, QN4, the output signals S5, S6 of the NAND circuits N1, N2 turn to high-level after a delay of a prescribed amount (after a prescribed time has passed). The NAND circuits N1 and N2 are connected in such a manner that the output of each NAND circuit is fed back to the input of the other. Thus, when the output signal S5 of the NAND circuit N1 becomes high-level at time $T_3$, the output signal S6 of the NAND circuit N2 turns to low-level gradually due to the gate capacity of the inverter In6 as shown in (g) of FIG. 2. Further, when the output signal S6 of the NAND circuit N2 becomes high-level at time $T_{13}$, the output signal S5 of the NAND circuit N1 turns to low-level gradually due to the gate capacity of the inverter In5 as shown in (h) of FIG. 2.

Figure 2:
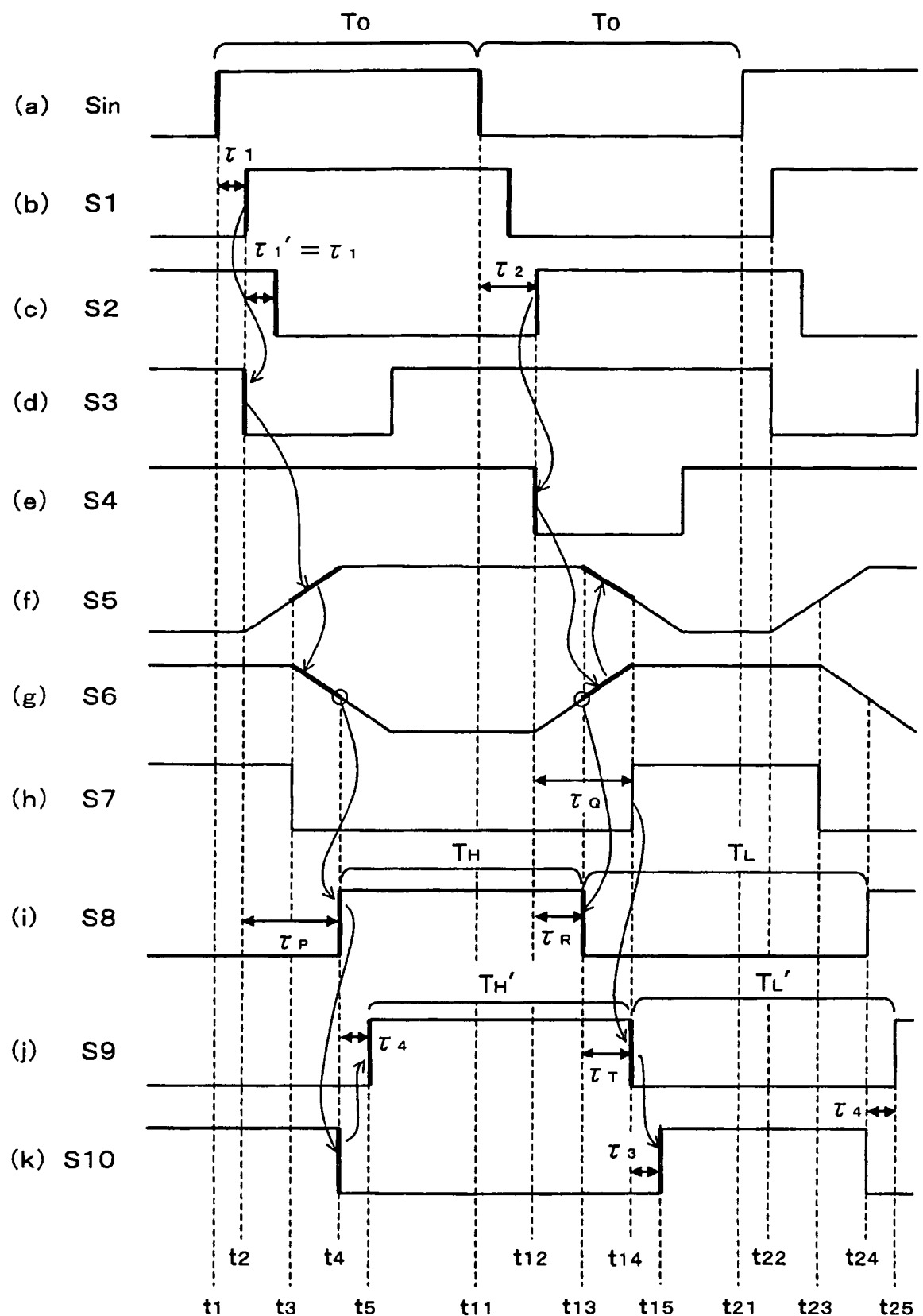
FIG. 2 is a timing chart for describing the action of the level shift device according to the first embodiment of the present invention.

The output signals S5, S6 of the NAND circuits N1, N2 are supplied to the inverters In7, In8, respectively, and as shown in (h), (i) of FIG. 2, supplied to the first, second inputs of the duty correcting circuit 30 after the polarities thereof are being inverted. It should be noted here that the first and second input signals S7 and S8 do not turn to high-level simultaneously. The rise edge of the output signal S7 of the inverter In7 comes after the fall edge of the output signal SB of the inverter In8 in terms of time.

The first input signal S7 of the duty correcting circuit 30 is supplied to the gate of the NMOS transistor QN5, and the second output signal S8 is supplied to the gate of the NMOS transistor QN6. With this, the input signal S9 of the inverter In10 turns to low-level in sync with the rise edge of the first input signal S7 at time $T_{14}$ in (j) of FIG. 2. Subsequently, after a time of delay 13 has passed, the output signal S10 of the inverter In10 turns to high-level. Further, the input signal S10 of the inverter S9 turns to low-level in sync with the rise edge of the second input signal S8 at time $T_4$ shown in (k) of FIG. 2. Subsequently, after a time of delay $\tau 4$ has passed, the level-shift output signal S9 that is the output of the inverter In9 turns to high-level.

Therefore, regarding the input signal Sin in one cycle from the time $T_1$ to time $T_{21}$, the level-shift output signal S9 of the output buffer B1 turns to high-level in the period from the time $T_5$ to time $T_{14}$, and turns to low-level in the period from the time $T_1$ to time $T_5$, and the period from the time $T_{14}$ to time $T_{21}$.

Through constituting the level shift circuit 20 into a circuit that is symmetrical with respect to the complementary signal (input signal), the length of the delay $\tau_P$ from the fall edge of the input signal S3 of the NAND circuit N1 to the rise edge of the output signal S8 of the inverter In8 becomes equal to the length of the delay $\tau_Q$ from the fall edge of the input signal S4 of the NAND circuit N2 to the rise edge of the output signal S7 of the inverter In7 (The same is true of the conventional technique).

Having this structure, through controlling the NMOS transistor QN5 with the output signal S7 of the inverter In7 in the duty correcting circuit 30, the fall edge of the output signal S8 of the inverter In8 is shifted back by an amount of $\tau_T (=\tau_Q-\tau_R=\tau_R)$ to the timing of the rise edge of the output signal S7 of the inverter In7 so that the corrected rise edge of the output signal S7 becomes the fall edge of the level-shift output signal S9. Further, through an inverse parallel connection of the inverter In9 and the inverter In10, the rise edge of the level-shift output signal S9 is retarded by $\tau_4$ with respect to the output signal S8 of the inverter In8. Through the shift processing by the amount of $\tau_T$ and $\tau_4$, the difference in the delay of $\tau_2$ and $\tau_1$ in the complementary signal generating circuit 10 is offset, thereby reducing the error in the duty ratio of the output signal with respect to the duty ratio of the input signal. The above will be described more specifically hereinafter.

Assuming here that the high-level period of the level-shift output signal S9 is $T_H'$, and the low-level period is $T_L'$, those can be expressed as $$T_H'=T_H-\tau_4+\tau_T$$

$T_L'=T_L-\tau_T+\tau_4$, and the difference $\Delta T$ between the high-level period $T_H'$ and the low-level period $T_L'$ can be expressed as $$\Delta T'=T_L'-T_H'.$$

Now, an investigation will be made to find out how much the difference $\Delta T'$ according to the embodiment differs from the similar difference $\Delta T (=T_L-T_H)$ of the conventional technique (that is, $\delta=\Delta T'-\Delta T$ is calculated).

$$\delta=\Delta T'-\Delta T$$

$$=T_L'-T_H'-\Delta T$$

$$=(T_L-\tau_T+\tau_4)-(T_H-\tau_4+\tau_T)-\Delta T$$

$$=(T_L-T_H)-\Delta T-\tau_T+\tau_4+\tau_4-\tau_T$$

$=2(\tau_4-\tau_T)$. Since $\tau_4<\tau_T$, it is found at last as $\delta<0$.

That is, for changing the high-level period $T_H$ of the signal S8 in (i) of FIG. 2 to the high-level period $T_H'$ of the level-shift output signal S9 in (j) of FIG. 2, the rise edge is shifted by an amount of $T_4$ along the normal direction while the fall edge is shifted by an amount of $\tau_T$ along the normal direction as well. Through this, the time width of the high-level period $T_H'$ is extended by the amount of $(\tau_T-\tau_4)$ as a result, comparing with the high-level period $T_H ((\tau_T-\tau_4)$ is a positive value). That is, in this embodiment, the high-level period $T_H$ that is shorter than the low-level period $T_L$ in the conventional technique is extended to modify the difference $\Delta T'$ between the low-level period $T_L'$ and the high-level period $T_H'$ and make it smaller than that of the conventional technique. In other words, the difference $\Delta T'$ between the low-level period $T_L'$ and the high-level period $T_H'$ in the case of this embodiment is smaller than the difference $\Delta T$ in the case of the conventional technique. This is equivalent to being "$\delta<0$".

The duty correcting circuit 30 generates a rectangular wave signal S7 by inverting the output signal S5 of the NAND circuit N1 in the R-S latch circuit LH of the level shift circuit 20 by using the inverter In7, and corrects the duty ratio of the output signal S8 of the level shift circuit 20 by utilizing the rectangular wave signal S7.

In this embodiment, the fall edge of the level-shift output signal S9 is defined by delaying the fall edge of the output signal S8 of the level shift circuit 20 to the rise edge of the rectangular wave signal S7. The delay time $\tau_T=(\tau_Q-\tau_R)=\tau_R$ at that time becomes relatively long since the original output signal S5 of the NAND circuit N1 in the rectangular wave signal S7 reduces gradually.

Further, in this embodiment, the inverters In9 and In10 are connected in inverse parallel connection so as to delay the rise edge of the output signal S8 of the level shift circuit 20 by an amount of $\tau_4$ and define the rise edge of the level-shift output signal S9. This delay time $\tau_4$ becomes shorter than the delay time $\tau_T$.

SECOND EMBODIMENT

Figure 3:
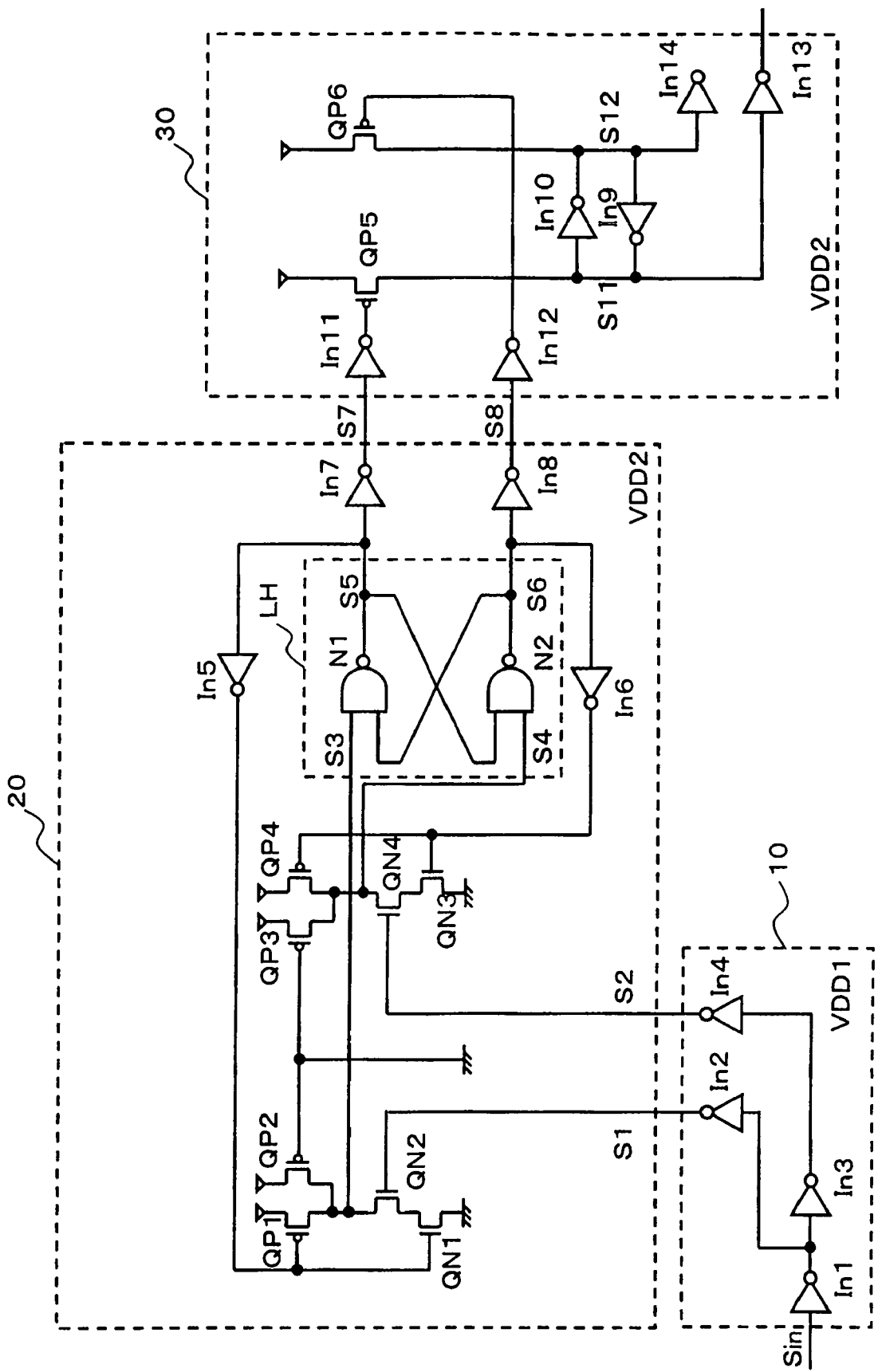
FIG. 3 is a circuit block diagram of a level shift device according to a second embodiment of the present invention.
Figure 4:
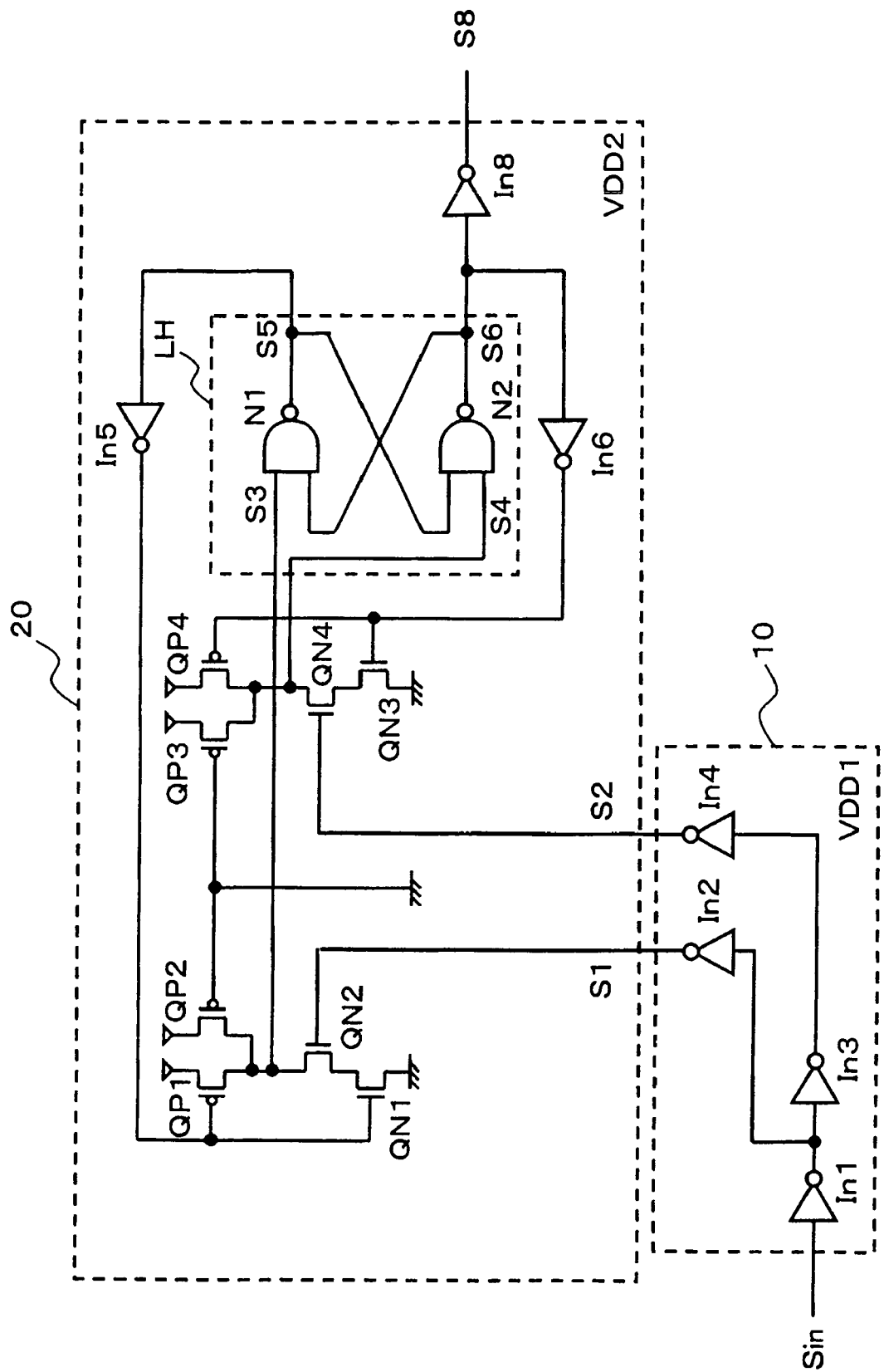
FIG. 4 is a circuit block diagram of a conventional level shift device.
Figure 5:
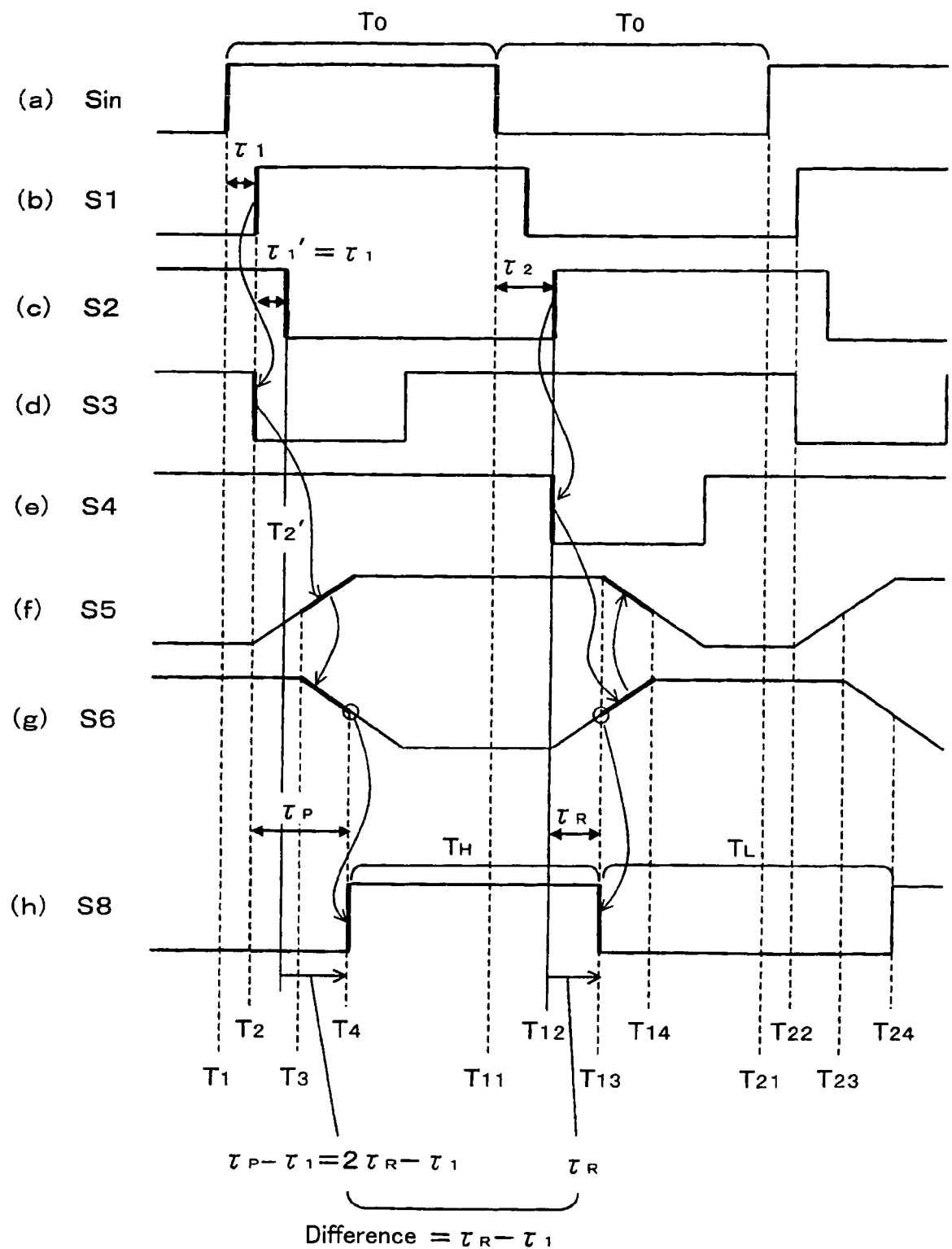
FIG. 5 is a timing chart for describing the action of the conventional level shift device.

FIG. 3 shows a circuit block diagram for showing the structure of a level shift device according to a second embodiment of the present invention. The level shift device of this embodiment comprises a first PMOS transistor QP5, a second PMOS transistor QP6, a first inverter In9, a second inverter In10, a third inverter In13, and a fourth inverter In14. In this embodiment, two output signals of the level shift circuit 20 are considered as the first and second input signals S7 and S8.

Regarding the first PMOS transistor QP5, the first input signal S7 is connected to the gate via the inverter In11, and the source thereof is connected to the high-potential power source. Regarding the second PMOS transistor QP6, the second input signal S8 is connected to the gate via the inverter In12, and the source thereof is connected to the high-potential power source. The input terminal of the first inverter In9 is connected to the drain of the second PMOS transistor QP6, and the output terminal thereof is connected to the drain of the first PMOS transistor QP5. The input terminal of the second inverter In10 is connected to the drain of the first PMOS transistor QP5, and the output terminal thereof is connected to the drain of the second PMOS transistor QP6. The third inverter In13 has the output signal of the first inverter In9 as the input signal thereof. The fourth inverter In14 has the output signal of the second inverter In10 as the input signal thereof. The action of the level shift device according to the second embodiment is the same as that of the first embodiment.

The present invention has been described in detail by referring to the most preferred embodiments. However, various combinations and modifications of the components are possible without departing from the spirit and the broad scope of the appended claims.

What is claimed is:

1. A level shift device, comprising:
    a level shift circuit which converts a voltage level of a single input signal into a first signal and a second signal; and
    a duty correcting circuit which reduces a difference in a duty ratio between said first signal and said second signal based on said first signal and said second signal;
    wherein said level shift circuit comprises an R-S latch circuit which converts a signal whose voltage level is being converted into said first and second signals, and
    wherein said duty correcting circuit comprises:
    a first NMOS transistor which has said first signal connected to its gate, and has its source grounded;
    a second NMOS transistor which has said second signal connected to its gate, and has its source grounded;
    a first inverter which has its input terminal connected to a drain of said second NMOS transistor, and has its output terminal connected to a drain of said first NMOS transistor;

a second inverter which has its input terminal connected to said drain of said first NMOS transistor, and has its output terminal connected to said drain of said second NMOS transistor;

a first buffer which level-shifts an output signal of said first inverter; and a second buffer to which an output signal of said second inverter is inputted.

2. The level shift device according to claim 1, wherein:

under a condition where said first signal is high-level and said second signal is low-level, an output of said first buffer becomes low-level and an output of said second buffer becomes high-level;

under a condition where said first signal is low-level and said second signal is high-level, said output of said first buffer becomes high-level and said output of said second buffer becomes low-level; and under a condition where said first and second signals are both low-level, said outputs of said first and second buffers are maintained.

3. A level shift device, comprising:

a level shift circuit which converts a voltage level of a single input signal into a first signal and a second signal;

a duty correcting circuit which reduces a difference in a duty ratio between said first signal and said second signal based on said first signal and said second signal; and a high-potential power source, wherein said level shift circuit comprises an R-S latch circuit which converts a signal whose voltage level is being converted into said first and second signals; and wherein said duty correcting circuit comprises:

a first PMOS transistor which has said first signal connected to its gate, and has its source grounded, a second PMOS transistor which has said second signal connected to its gate, and has its source connected to said high-potential power source, a first inverter which has its input terminal connected to a drain of said second PMOS transistor, and has its output terminal connected to a drain of said first PMOS transistor, a second inverter which has its input terminal connected to said drain of said first PMOS transistor, and has its output terminal connected to said drain of said second PMOS transistor, a first buffer which level-shifts an output signal of said first inverter, and a second buffer to which an output signal of said second inverter is inputted.

4. The level shift device according to claim 3, wherein:

under a condition where said first signal is high-level and said second signal is low-level, an output of said first buffer becomes low-level and an output of said second buffer becomes high-level;

under a condition where said first signal is low-level and said second signal is high-level, said output of said first buffer becomes high-level and said output of said second buffer becomes low-level; and under a condition where said first and second signals are both low-level, said outputs of said first and second buffers are maintained.

5. A level shift device, comprising:

a level shift circuit which converts a voltage level of a single input signal into a first signal and a second signal; and a duty correcting circuit which reduces a difference in a duty ratio between said first signal and said second signal based on said first signal and said second signal;

wherein said level shift circuit comprises an R-S latch circuit which converts a signal whose voltage level is being converted into said first and second signals, and wherein said duty correcting circuit comprises:

a first NMOS transistor which has said first signal connected to its gate, and has its source grounded;

a second NMOS transistor which has said second signal connected to its gate, and has its source grounded;

a first inverter which has its input terminal connected to a drain of said second NMOS transistor, and has its output terminal connected to a drain of said first NMOS transistor; and a second inverter which has its input terminal connected to said drain of said first NMOS transistor, and has its output terminal connected to said drain of said second NMOS transistor.

6. A level shift device, comprising:

a level shift circuit which converts a voltage level of a single input signal into a first signal and a second signal;

a duty correcting circuit which reduces a difference in a duty ratio between said first signal and said second signal based on said first signal and said second signal; and a high-potential power source, wherein said level shift circuit comprises an R-S latch circuit which converts a signal whose voltage level is being converted into said first and second signals; and wherein said duty correcting circuit comprises:

a first PMOS transistor which has said first signal connected to its gate, and has its source grounded, a second PMOS transistor which has said second signal connected to its gate, and has its source connected to said high-potential power source, a first inverter which has its input terminal connected to a drain of said second PMOS transistor, and has its output terminal connected to a drain of said first PMOS transistor, and a second inverter which has its input terminal connected to said drain of said first PMOS transistor, and has its output terminal connected to said drain of said second PMOS transistor.

* * * * *